(12) United States Patent
Igarashi et al.

(10) Patent No.: US 12,381,096 B2
(45) Date of Patent: Aug. 5, 2025

(54) ETCHING METHOD AND ETCHING APPARATUS

(71) Applicant: TOKYO ELECTRON LIMITED, Tokyo (JP)

(72) Inventors: Yoshiki Igarashi, Nirasaki (JP); Satoru Kikushima, Hsin-chu (TW); Takayuki Suga, Nirasaki (JP); Jun Lin, Nirasaki (JP); Chengya Chu, Hsin-chu (TW)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 18/451,826

(22) Filed: Aug. 17, 2023

(65) Prior Publication Data

US 2023/0395400 A1     Dec. 7, 2023

Related U.S. Application Data

(62) Division of application No. 17/319,514, filed on May 13, 2021, now Pat. No. 11,791,175.

(30) Foreign Application Priority Data

May 15, 2020    (JP) ................................. 2020-085747

(51) Int. Cl.
*H01L 21/67* (2006.01)
*H01L 21/311* (2006.01)

(52) U.S. Cl.
CPC ... *H01L 21/67069* (2013.01); *H01L 21/31116* (2013.01)

(58) Field of Classification Search
None
See application file for complete search history.

(56) References Cited

U.S. PATENT DOCUMENTS

| | | | |
|---|---|---|---|
| 11,715,641 B2 | 8/2023 | Suzuki et al. | |
| 2005/0269294 A1 | 12/2005 | Igarashi et al. | |
| 2008/0124936 A1 | 5/2008 | Nishimura | |
| 2008/0142483 A1 | 6/2008 | Hua et al. | |
| 2013/0130499 A1* | 5/2013 | Ugajin | H01L 21/76224 438/689 |
| 2015/0187593 A1 | 7/2015 | Narushima et al. | |
| 2017/0243753 A1 | 8/2017 | Imai et al. | |

(Continued)

FOREIGN PATENT DOCUMENTS

| | | |
|---|---|---|
| JP | 2005-039185 A | 2/2005 |
| JP | 2008-160000 A | 7/2008 |

(Continued)

OTHER PUBLICATIONS

United States Office Action, U.S. Appl. No. 17/319,514, Nov. 29, 2022, 10 pages.

*Primary Examiner* — Shamim Ahmed
(74) *Attorney, Agent, or Firm* — Fenwick & West LLP

(57) ABSTRACT

An etching method for selectively etching a material containing Si and O is provided. The etching method includes providing a substrate containing the material containing Si and O in a chamber, repeating a first period for supplying a basic gas, which is started first, and a second period for supplying a fluorine-containing gas, which is started next, with at least a part of the second period not overlapping with the first period, and heating and removing a reaction product generated by the supply of the basic gas and the supply of the fluorine-containing gas.

6 Claims, 14 Drawing Sheets

(56) References Cited

U.S. PATENT DOCUMENTS

2017/0294319 A1* 10/2017 Ogiwara ........... H01L 21/67069
2019/0221440 A1*  7/2019 Asada ................... B08B 7/0071
2019/0378724 A1  12/2019 Toda et al.
2021/0375634 A1  12/2021 Suzuki et al.

FOREIGN PATENT DOCUMENTS

| KR | 10-2015-0076099 A | 7/2015 |
| KR | 10-2017-0099778 A | 9/2017 |
| KR | 10-2019-0088009 A | 7/2019 |
| KR | 10-2019-0139770 A | 12/2019 |
| WO | WO 2020/054476 A1 | 3/2020 |

* cited by examiner

FIG.10
(Related Art)

PATTERN 1 (CONVENTIONAL CASE)

| HF | | 3.0sec | | HEATING AND REMOVING AFS (60 sec) |
|---|---|---|---|---|
| NH$_3$ | | | → | |
| Ar/N$_2$ | | | → | |

FIG.11

PATTERN 2 (HF PULSE)

| HF | | 1.5sec | | 1.5sec | | HEATING AND REMOVING AFS (60 sec) |
|---|---|---|---|---|---|---|
| NH$_3$ | | | | | → | |
| Ar/N$_2$ | | | | | → | |

FIG.12

PATTERN 3 (SYNCHRONIZING PULSE)

| HF | | 1.5sec | | 1.5sec | HEATING AND REMOVING AFS (60 sec) |
|---|---|---|---|---|---|
| NH$_3$ | | 1.5sec | | 1.5sec | |
| Ar/N$_2$ | | | | | |

FIG.13

PATTERN 4 (PRESENT EMBODIMENT)

| HF | | | 1.5sec | | 1.5sec | HEATING AND REMOVING AFS (60 sec) |
|---|---|---|---|---|---|---|
| NH$_3$ | | 1.5sec | | 1.5sec | | |
| Ar/N$_2$ | | | | | | |

ETCHING METHOD AND ETCHING APPARATUS

CROSS-REFERENCE TO RELATED APPLICATION

This application is a divisional application of U.S. patent application Ser. No. 17/319,514 filed on May 13, 2021, now U.S. Pat. No. 11,791,175 issued on Oct. 17, 2023, which claims priority to Japanese Patent Application No. 2020-085747 filed on May 15, 2020, the entire contents of all of which are incorporated herein by reference.

TECHNICAL FIELD

The present disclosure relates to an etching method and an etching apparatus.

BACKGROUND

In recent years, in a semiconductor device manufacturing process, a chemical oxide removal (COR) method in which etching is chemically performed without generating plasma in a chamber has attracted attention. As an example of the COR method, there is known a technique for etching a silicon dioxide ($SiO_2$) film formed on a surface of a semiconductor wafer that is a substrate by using hydrogen fluoride (HF) gas that is a fluorine-containing gas and ammonia ($NH_3$) gas that is a basic gas (see, e.g., Japanese Patent Application Publication Nos. 2005-39185 and 2008-160000). In this technique, HF gas and $NH_3$ gas react with the silicon oxide film to thereby generate ammonium fluorosilicate (($NH_4)_2SiF_6$, AFS), and the AFS is heated and sublimated so that the silicon oxide film is etched.

SUMMARY

In view of the above, the present disclosure provides an etching method and an etching apparatus capable of etching a film containing Si and O with high selectivity.

In accordance with an aspect of the present disclosure, there is provided an etching method for selectively etching a material containing Si and O, including: providing a substrate containing the material containing Si and O in a chamber; repeating a first period for supplying a basic gas, which is started first, and a second period for supplying a fluorine-containing gas, which is started next, with at least a part of the second period not overlapping with the first period; and heating and removing a reaction product generated by the supply of the basic gas and the supply of the fluorine-containing gas.

BRIEF DESCRIPTION OF THE DRAWINGS

The objects and features of the present disclosure will become apparent from the following description of embodiments, given in conjunction with the accompanying drawings, in which:

FIG. 10 shows a pattern 1 (conventional case) used in a test example;

FIG. 11 shows a pattern 2 (HF pulse) used in the test example;

FIG. 12 shows a pattern 3 (synchro pulse) used in the test example;

FIG. 13 shows a pattern 4 (embodiment) used in the test example;

DETAILED DESCRIPTION

Hereinafter, embodiments will be described in detail with reference to the accompanying drawings.

<Etching Apparatus>

Figure 1:
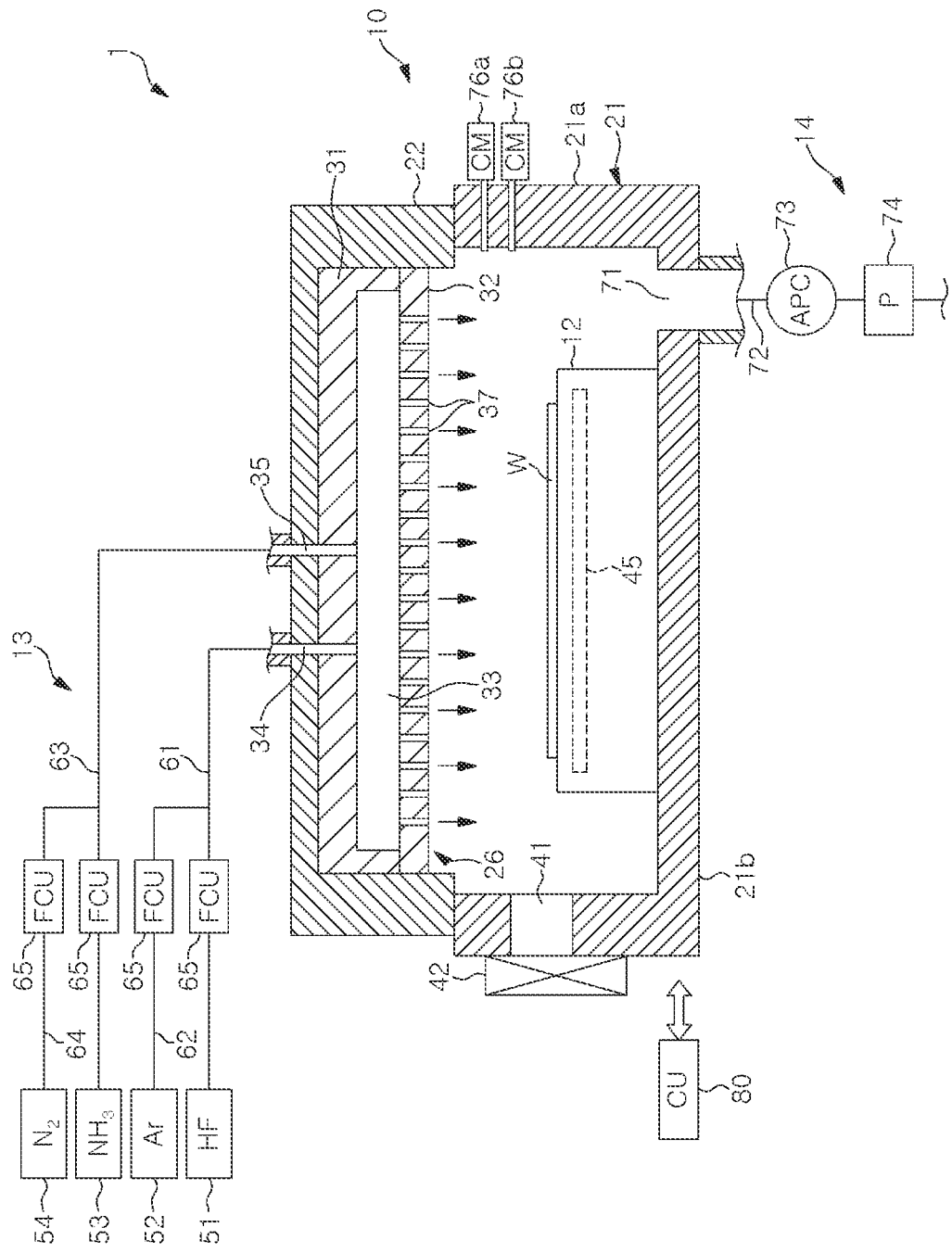
FIG. 1 is cross-sectional view showing an example of an etching apparatus for performing an etching method of an embodiment.

FIG. 1 is a cross-sectional view showing an example of an etching apparatus for performing an etching method according to an embodiment. The etching apparatus shown in FIG. 1 etches a material containing Si and O formed on a surface of a substrate, for example. A typical example of the material containing Si and O may be $SiO_2$, but SiON, SiOCN, and SiOC may also be used. Further, the material containing Si and O is typically a film.

As shown in FIG. 1, the etching apparatus 1 includes a chamber 10 having an airtight structure, and a substrate support 12 on which the substrate W is placed in a substantially horizontal state is disposed in the chamber 10. A semiconductor wafer such as an Si wafer is used as an example of the substrate W, but the substrate is not limited thereto.

The etching apparatus 1 further includes a gas supply mechanism 13 for supplying a processing gas to the chamber 10 and an exhaust mechanism 14 for exhausting the inside of the chamber 10.

The chamber 10 includes a chamber body 21 and a lid 22. The chamber body 21 has a substantially cylindrical sidewall portion 21a and a bottom portion 21b. The chamber body 12 has an upper opening that is closed by the lid 22. The lid 22 has therein a recess. A sealing member (not shown) is provided between the sidewall portion 21a and the lid 22 to ensure airtightness in the chamber 10.

A shower head 26 that is a gas introducing member is fitted into the lid 22 to face the substrate support 12. The shower head 26 has a cylindrical body 31 having a sidewall and an upper wall, and a shower plate 32 disposed at a bottom portion of the body 31. A sealing ring (not shown) is provided between an outer peripheral portion of the body 31 and the shower plate 32 to have an airtight structure. Further, a space 33 for diffusing a gas is formed between a central portion of the body 31 and the shower plate 32. The shape of the space 33 is illustrated in a simplified manner for the sake of convenience.

A first gas inlet hole 34 and a second gas inlet hole 35 are vertically formed through a ceiling wall of the lid 22 and are connected to the space 33 while extending through an upper wall of the shower head 26. A plurality of gas injection holes 37 extending vertically from the space 33 is formed through the shower plate 32 toward the inside of the chamber 10.

Therefore, in the shower head 26, gases supplied to the space 33 from the first gas inlet hole 34 and the second gas inlet hole 35 are mixed in the space 33. The gas mixture is then injected through the gas injection holes 37.

The sidewall portion 21a of the chamber body 21 is provided with a loading/unloading port 41 for loading and unloading a substrate W. The loading/unloading port 41 is opened and closed by a gate valve 42. The substrate W is transferred to and from an adjacent module through the loading/unloading port 41.

The substrate support 12 has a substantially circular shape in plan view and is fixed to the bottom portion 21b of the chamber 10. A temperature controller 45 for adjusting a temperature of the substrate support 12 is disposed in the substrate support 12. The temperature controller 45 may be, for example, a resistance heater or a flow path through which a temperature control medium (e.g., water or the like) for adjusting a temperature circulates. The temperature controller 45 adjusts the temperature of the substrate support 12 to a desired temperature, so that the temperature of the substrate W placed on the substrate support 12 is controlled.

The gas supply mechanism 13 includes an HF gas supply source 51, an Ar gas supply source 52, an $NH_3$ gas supply source 53, and an $N_2$ gas supply source 54.

The HF gas supply source 51 is configured to supply HF gas as a fluorine-containing gas. Here, HF gas is described as an example of the fluorine-containing gas, but the fluorine-containing gas may be $F_2$ gas, $ClF_3$ gas, or $NF_3$ gas in place of HF gas.

The $NH_3$ gas supply source 53 is configured to supply $NH_3$ gas as a basic gas. Here, $NH_3$ gas is described as an example of the basic gas, but the basic gas may be amine gas in place of $NH_3$ gas. The amine gas may be a methylamine gas, a dimethylamine gas, a trimethylamine gas, or the like.

The Ar gas supply source 52 and the $N_2$ gas supply source 54 are configured to supply $N_2$ gas and Ar gas as an inert gas having functions of a dilution gas, a purge gas, and a carrier gas. However, both sources may supply Ar gas or both sources may supply $N_2$ gas. Further, the inert gas is not limited to Ar gas and $N_2$ gas, and another noble gas such as He gas may be used.

One ends of first to fourth gas supply lines 61 to 64 are connected to the gas supply sources 51 to 54, respectively. The other end of the first gas supply line 61 connected to the HF gas supply source 51 is connected to the first gas inlet hole 34. The other end of the second gas supply line 62 connected to the Ar gas supply source 52 is connected to the first gas supply line 61. The other end of the third gas supply line 63 connected to the $NH_3$ gas supply source 53 is connected to the second gas inlet hole 35. The other end of the fourth gas supply line 64 connected to the $N_2$ gas supply source 54 is connected to the third gas supply line 63.

HF gas that is a fluorine-containing gas and $NH_3$ gas that is a basic gas reach the shower head 26 together with Ar gas and $N_2$ gas serving as the inert gases, respectively, through the first gas inlet hole 34 and the second gas inlet hole 35, and then are injected into the chamber through the gas injection holes 37 of the shower head 26.

Each of the first to fourth gas supply lines 61 to 64 is provided with a flow control unit (FCU) 65 for controlling opening/closing of a flow path and a gas flow. Each flow control unit 65 includes, for example, an opening/closing valve and a flow controller such as a mass flow controller (MFC) or a flow control system (FCS).

The exhaust mechanism 14 has an exhaust line 72 connected to an exhaust port 71 formed at the bottom portion 21b of the chamber 10. Further, the exhaust mechanism 14 has an automatic pressure control valve (APC) 73 for controlling a pressure in the chamber 10 and a vacuum pump (P) 74 for exhausting the inside of the chamber 10 that are disposed in the gas exhaust line 72.

Two capacitance manometers (CM) 76a and 76b, one for high pressure and one for low pressure, are disposed on the sidewall of the chamber 10 to control a pressure in the chamber A temperature sensor (not shown) for detecting a temperature of the substrate W is disposed near the substrate W placed on the substrate support 12.

The chamber 10, the shower head 26, and the substrate support 12 constituting the etching apparatus 1 are made of a metal such as aluminum. A film such as an oxide film may be formed on the surfaces thereof. When they are made of aluminum, an anodic oxide film ($Al_2O_3$) may be formed, for example. Alternatively, the film may be a ceramic coating film.

The etching apparatus 1 further has a control unit (CU) 80. The control unit 80 is a computer and includes a main controller having a CPU, an input device, an output device, a display device, and a storage device (storage medium). The main controller controls operations of the individual components of the etching apparatus 1 based on a control program stored in the storage medium (a hard disk, an optical disk, a semiconductor memory, or the like) built in the storage device. A processing recipe is stored as the control program in the storage medium, and the processing of the etching apparatus 1 is executed based on the processing recipe.

Further, the etching apparatus of FIG. 1 may have an auxiliary unit for exciting a gas by plasma, but it is preferable to perform non-plasma etching.

<Etching Method>

Next, an embodiment of an etching method performed by the etching apparatus 1 described above will be described. The following etching method is performed under the control of the control unit 80.

Figure 2:
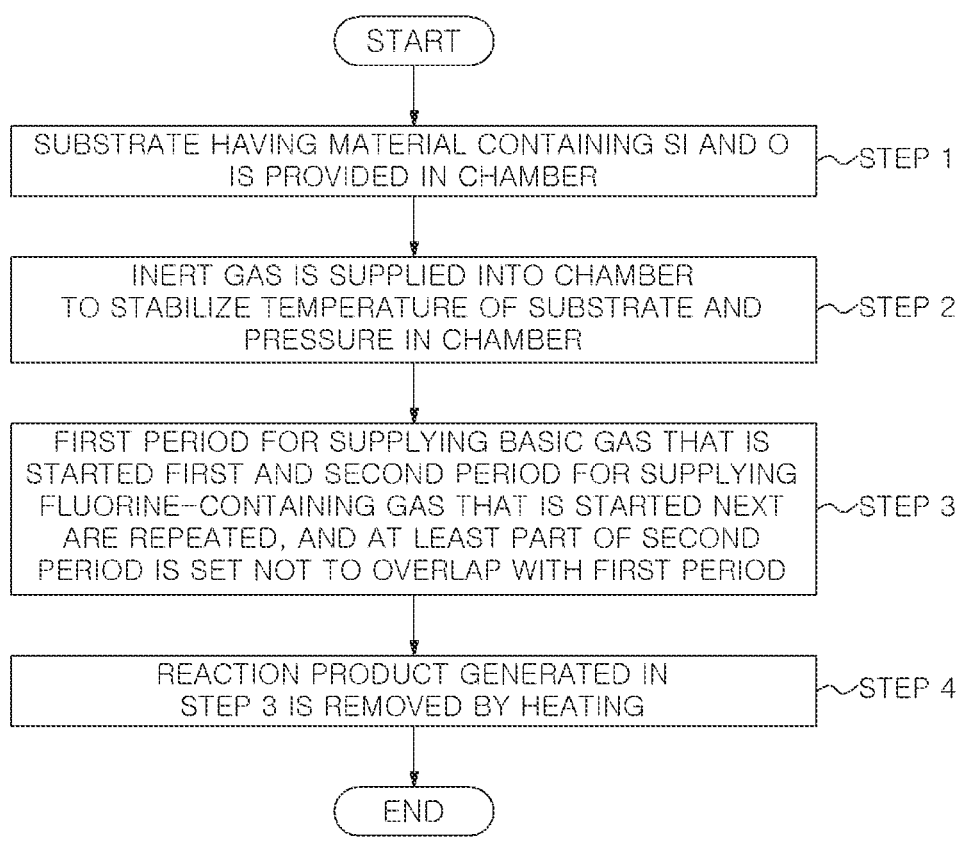
FIG. 2 is a flowchart showing an etching method according to an embodiment.

FIG. 2 is a flowchart showing an etching method according to an embodiment.

First, a substrate W having a material containing Si and O is provided in the chamber 10 (step 1). Specifically, the substrate W is loaded into the chamber 10 and placed on the substrate support 12 whose temperature has been controlled by the temperature controller 45.

Figure 3:
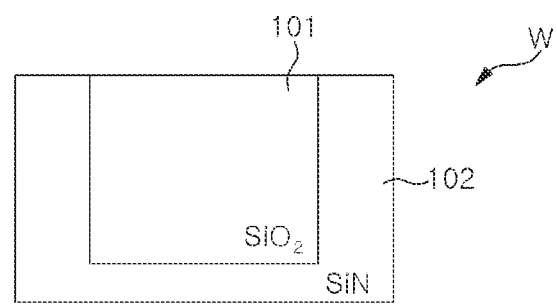
FIG. 3 schematically shows an example of a structure of a substrate to which the etching method according to the embodiment is applied.

The substrate W may have a structure schematically shown in FIG. 3, for example. In the example of FIG. 3, an $SiO_2$ film 101 containing Si and O that is an etching target material and an SiN film 102 that is a non-etching material are formed on a base (not shown) of the substrate W. However, the structure of the substrate W is not limited to that shown in FIG. 3.

In the example of FIG. 3, the $SiO_2$ film 101 can be etched with a desired selectivity with respect to the SiN film 102. However, the non-etching material that can allow the desired selectivity to be obtained in the case of etching the $SiO_2$ film 101 is not limited to SiN, and may be any material containing Si and N and/or C. The material can be one or more selected from SiN, SiON, SiOCN, SiOC, SiCN, and SiC. They are typically formed as films.

Further, the etching target material is not limited to $SiO_2$ as long as it is a material containing Si and O, and one or more selected from $SiO_2$, SiON, SiOCN, and SiOC may be used. They are typically formed as films. Among them, materials other than $SiO_2$ can also be etched with a desired selectivity with respect to SiN, SiON, SiOCN, SiOC, SiCN, and SiC.

SiOCN and SiOC are low-k films and can be used as both etching target films and non-etching films. For example, in the case of an SiOCN film and an SiOC film, a film having a low C concentration (<6 at %) can be used as an etching target film, and a film having a high C concentration (<10 at %) can be used as a non-etching film.

Typically, an $SiO_2$ film may be used as the etching target material and an SiN film may be used as the non-etching material as described above. However, it is also preferable to use an SiOCN film that is a low-k film as the non-etching material.

Next, an inert gas (Ar gas, $N_2$ gas) is supplied from the gas supply mechanism 13 into the chamber 10 to stabilize a temperature of the substrate W and a pressure in the chamber 10 (step 2).

Next, a first period for supplying a basic gas, e.g., $NH_3$ gas, which is started first, and a second period for supplying a fluorine-containing gas, e.g., HF gas, which is started next, are repeated while supplying the inert gas from the gas supply mechanism 13. Further, at least a part of the second period is set not to overlap with the first period (step 3).

Next, the reaction product generated in step 3 is removed by heating (step 4). In the case of supplying $NH_3$ gas in combination with HF gas, $(NH_4)_2SiF_6$ (AFS) is generated as the reaction product.

Figure 4:
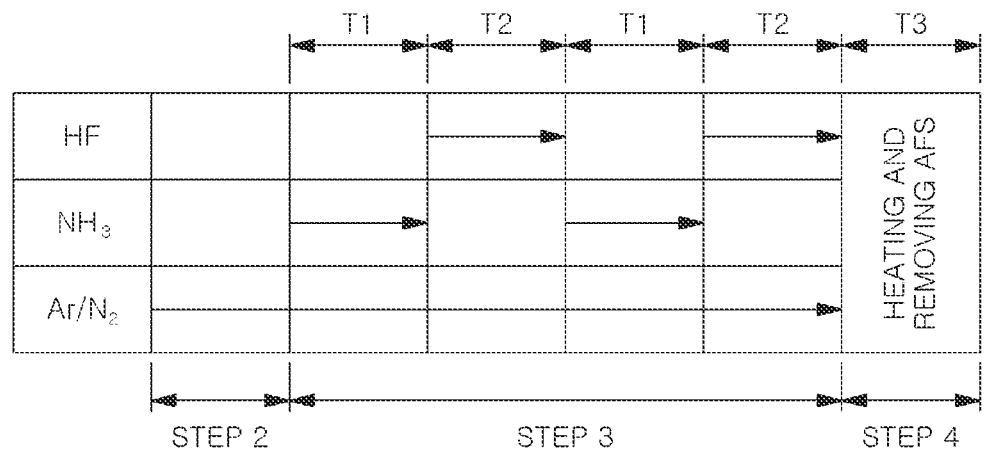
FIG. 4 shows a typical example of step 3.

A typical example of step 3 is shown in FIG. 4. Step 2 and step 4 are shown in FIG. 4 as well. After the stabilization of step 2, the first period T1 for supplying the basic gas ($NH_3$ gas) is started and, then, the second period T2 for supplying the fluorine-containing gas (HF gas) is consecutively started after the end of the first period T1 in a state where the inert gas (Ar gas and $N_2$ gas) constantly flows in the chamber. The first period T1 and the second period T2 are repeated. After step 3, the heat treatment of step 4 for removing the reaction product is performed (third period T3).

Figure 5:
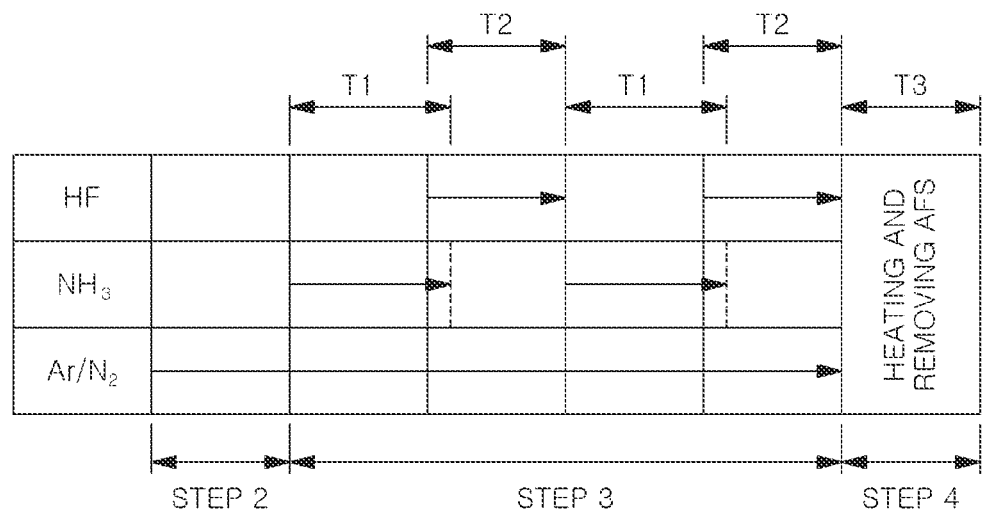
FIG. 5 shows another example of step 3.
Figure 6:
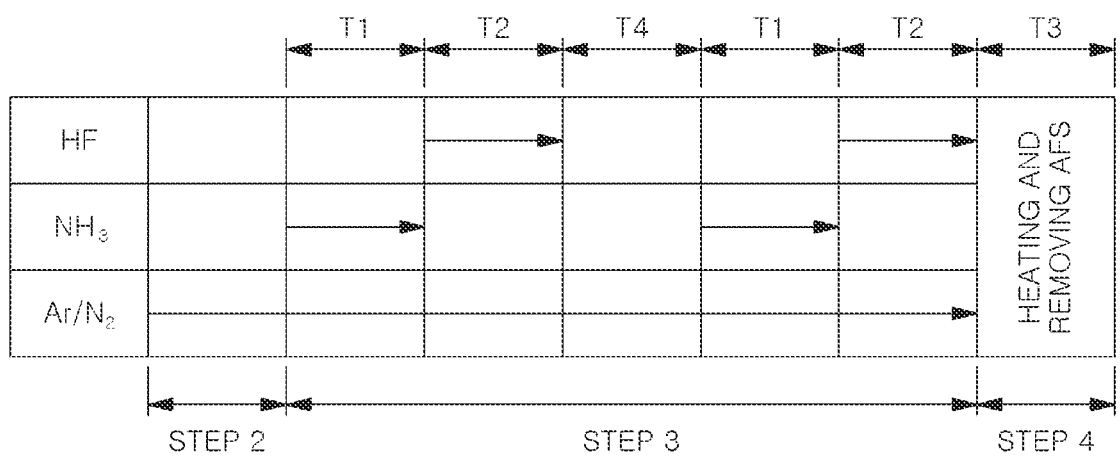
FIG. 6 shows still another example of step 3.

In step 3, as shown in FIG. 5, the first period T1 may partially overlap with the second period T2. Further, as shown in FIG. 6, a fourth period T4 for purging the chamber 10 may be inserted between the second period T2 and a next first period T1. Here, the purging is performed by supplying only the inert gas (Ar gas and $N_2$ gas). The series of operations of (a) the repetitions of the first period T1 for the supply of the basic gas and the second period T2 for the supply of the fluorine-containing gas and (b) the third period T3 for the heat treatment that is performed subsequent to the repetitions may be performed only once, or may be repeated twice or more.

As described above, typically, $NH_3$ gas may be used as the basic gas and HF gas may be used as the fluorine-containing gas. Instead, amine gas may be used as the basic gas, and $F_2$ gas, $ClF_3$ gas, or $NF_3$ gas may be used as the fluorine-containing gas.

Figure 7A:
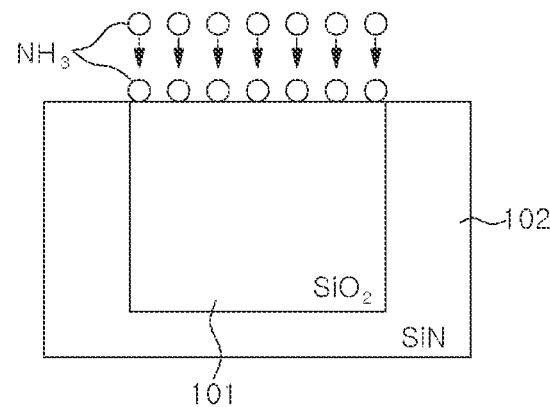
FIGS. 7A to 7C show a mechanism of the etching method according to the embodiment.
Figure 7B:
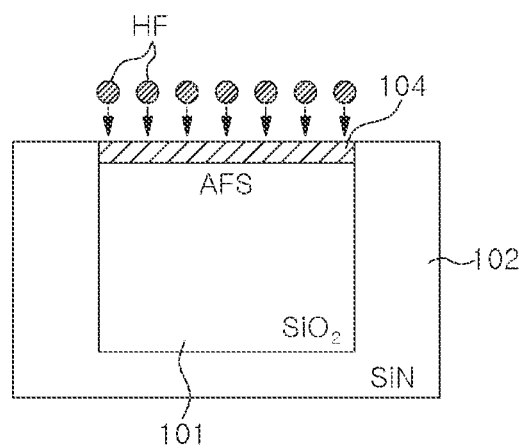
Figure 7C:
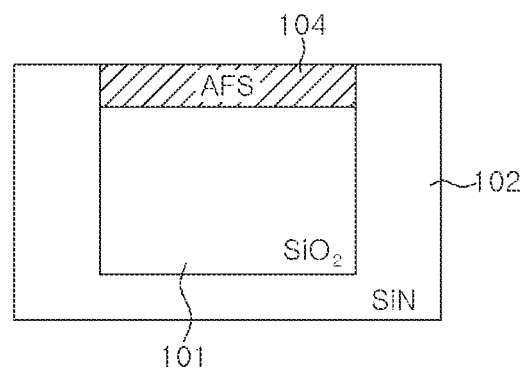

As an example of the mechanism of step 3, the etching of the $SiO_2$ film 101 shown in FIG. 3 using $NH_3$ gas as the basic gas and HF gas as the fluorine-containing gas will be described. First, in the first period T1 for supplying $NH_3$ gas, the supplied $NH_3$ gas is adsorbed on the surface of the substrate W as shown in FIG. 7A. Then, in the second period T2, as shown in FIG. 7B, the supplied HF gas reacts with the adsorbed $NH_3$ gas and the $SiO_2$ film 101 to generate $(NH_4)_2SiF_6$ (AFS) 104 as a reaction product. By repeating such processes twice or more, the AFS 104 that is the reaction product is formed at a desired depth, as shown in FIG. 7C.

Figure 8A:
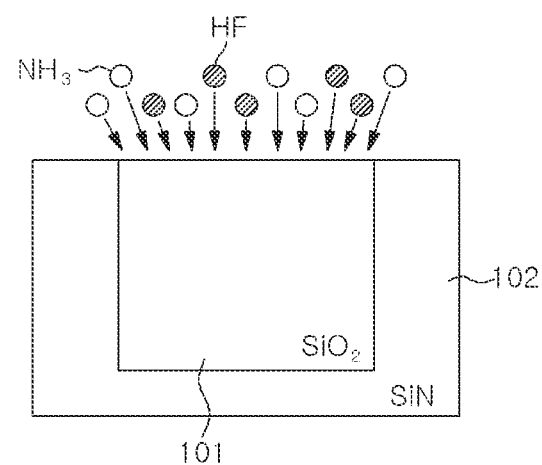
FIGS. 8A and 8B show a mechanism of a conventional etching method.
Figure 8B:
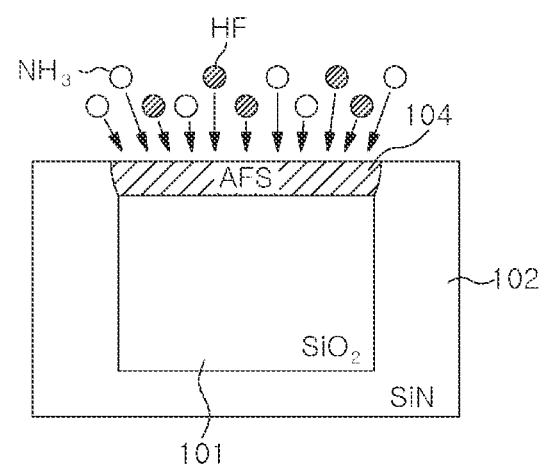
Figure 8C:
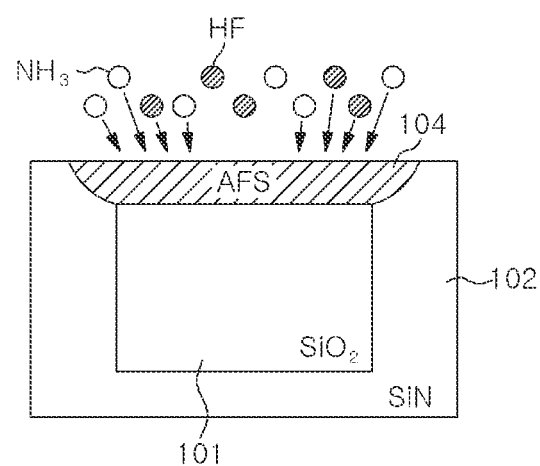
FIG. 8C shows the mechanism of the conventional etching method and schematically shows a state after heat treatment for removing an etching residue in step 4.

On the other hand, in a conventional case, the supply of $NH_3$ gas is started first and, then, HF gas is supplied while supplying the $NH_3$ gas, as shown in FIG. 8A. Accordingly, a reaction in which the AFS 104 is constantly generated occurs as shown in FIG. 8B. As the etching progresses, as shown in FIG. 8C, the generation amount of the AFS 104 increases, and the etching of the SiN film 102 due to the reaction between the AFS 104 and the excessive amount of $NH_3$ progresses, which results in a decrease in the selectivity with respect to the SiN film 102.

In the present embodiment, as described above, the generation amount of the AFS 104 is determined by the amount of $NH_3$ gas adsorbed in the first period T1, so that it is easy to control the amount of the AFS 104 to a small amount. Further, in the second period T2, only HF gas is supplied and $NH_3$ gas is not supplied, or HF gas is supplied and $NH_3$ gas is supplied only during the overlapping period between the first period T1 and the second period T2. Therefore, the controllability of the generation amount of AFS can be improved, and the etching of the SiN film 102 due to the reaction between the AFS 104 and $NH_3$ gas as described in the conventional case can be suppressed, which makes it possible to etch the $SiO_2$ film 101 with a high selectivity. Since the etching proceeds in a state where AFS that is the reaction product exists, a desired etching amount can be maintained. The state in which AFS exists on the surface may be considered as the state in which $NH_3$ and HF are already adsorbed on the surface and, thus, the incubation time of the etching reaction is shortened.

This is the same in the case of using another basic gas and another fluorine-containing gas and in the case of using a material containing Si and O other than $SiO_2$ as an etching target material.

As described above, in step 3, the pulse-shaped gas supply of repeating the supply of the basic gas that is performed first and the supply of the fluorine-containing gas that is subsequently performed is performed, and the fluorine-containing gas is not supplied first. If the fluorine-containing gas is supplied first, the etching amount becomes extremely small. As described above, the chamber 10 may be purged between the second period T2 for supplying the fluorine-containing gas and a next first period T1 for supplying the basic gas. However, the purging is not performed between the initial first period T1 and the second period T2. This is because if the purging is performed between the initial first period T1 and the second period T2, the basic gas ($NH_3$ gas) adsorbed on the surface is removed, so that the etching reaction is less likely to occur.

In step 3, the balance between the etching amount (etching rate) and the selectivity can be appropriately controlled by using the lengths of the first period T1 and the second period T2, the flow rates of the basic gas and the fluorine-containing gas, the number of repetitions of the first period T1 and the second period T2, the execution or non-execution of purging, and the like.

As the first period T1 or the second period T2 is increased, the etching amount (etching rate) is increased. As the first period T1 or the second period T2 is decreased, the selectivity is increased. Further, the etching amount (etching rate) is increased as the number of repetitions of the first period T1 and the second period T2 before the third period T3 for removing the reaction product such as AFS is increased. The selectivity is increased as the number of repetitions of the first period T1 and the second period T2 before the third period T3 is decreased. The first period T1 and the second period T2 preferably is within a range from 0.5 sec to 10 sec, and it is preferable to repeat the first period T1 and the second period T2 twice to ten times before the third period T3. When it is desired to increase the etching rate in terms of efficiency, it is preferable to lengthen the first period T1 or the second period T2 within the above range and/or to increase the number of repetitions within the above range. When the selectivity is more significant than the efficiency, it is preferable to shorten the first period T1 or the second period T2 within the above range and/or to reduce the number of repetitions within the above range.

Further, the etching amount (etching rate) is increased as the flow rates of the basic gas such as $NH_3$ gas and the fluorine-containing gas such as HF gas are increased, and the selectivity is increased as the flow rates of the basic gas and the fluorine-containing gas are decreased. The flow rate of the basic gas is preferably within a range from 20 sccm to 500 sccm, and the flow rate of the fluorine-containing gas is preferably within a range from 20 sccm to 500 sccm.

By purging the chamber 10 after the second period T2 for supplying the fluorine-containing gas, a remaining gas is discharged and, thus, the selectivity can be further increased while maintaining the etching amount. However, the processing time is increased by the length of the fourth period T4 for performing the purging. In the above example, the purging is performed by supplying a purge gas such as Ar gas or $N_2$ gas while evacuating the chamber 10. However, the purging may be performed only by evacuating the chamber 10. In the case of performing the purging, the fourth period T4 for performing the purging is preferably within a range from 0.5 to 5 sec.

The temperature at the time of etching using the basic gas and the fluorine-containing gas performed in the first period T1 and the second period T2 of step 2 is preferably 80° C. or lower, and more preferably in a range between 60° C. and 80° C. By setting the temperature to or lower, the reaction product such as AFS remains, which makes it possible to perform etching with the improved controllability as described above. Further, the pressure at the time of etching is preferably within a range from 2.67 Pa to 6666 Pa (0.02 Torr to 50 Torr). As the pressure is increased, the etching amount (etching rate) is increased and the selectivity is decreased.

The heat treatment for removing the reaction product in step 4 can be performed by heating the substrate W after the end of step 3 and evacuating the chamber 10 while supplying an inert gas such as Ar gas and/or $N_2$ gas. The heating temperature at this time may be the same as that in step 3, but performing the heating at a higher temperature may improve the removal efficiency. Step 4 may be performed in a chamber different from the chamber 10. The period of the heat treatment for removing the reaction product varies depending on the generation amount of the reaction product, but is preferably in a range from 15 sec to 120 sec. By periodically performing the heat treatment for removing the reaction product, the reaction product (AFS) is completely removed and the inside of the chamber 10 is refreshed, which improves the process stability.

In step 3, as described above, the $SiO_2$ film can be etched with a high selectivity by performing the first period T1 for supplying the basic gas and the second period T2 for supplying the fluorine-containing gas in a pulsed manner. However, the surface roughness or the loading effect may occur depending on conditions.

When the surface roughness occurs, it is effective to increase the number of repetitions of the first period T1 and the second period T2 and increase the pressure during processing. However, since the increase in the number of repetitions and the increase in the pressure result in a decrease in the selectivity (increase in shoulder loss), it is necessary to appropriately set the conditions depending on required characteristics. For example, both can be achieved by changing the conditions (having multi-steps) such as increasing the pressure only in the last few cycles.

The loading effect is a phenomenon of the etching amount varying depending on whether the pattern is the dense pattern (Dense) or the sparse pattern (Iso). When the loading effect occurs, it is effective to increase the number of repetitions, lengthen the first period T1 and/or the second period T2, increase the flow rate of the basic gas and/or the fluorine-containing gas, and increase the pressure.

Figure 9:
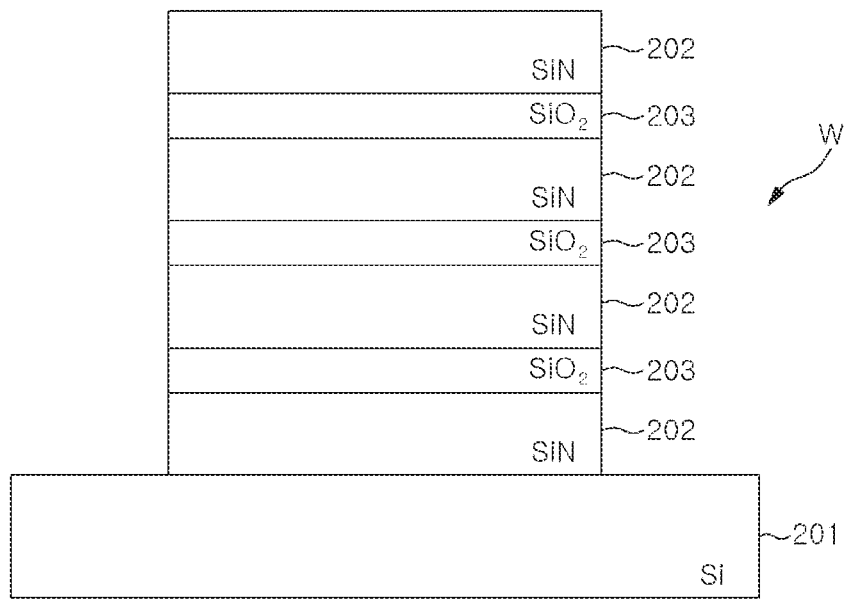
FIG. 9 schematically shows another example of the structure of the substrate to which the etching method according to the embodiment is applied.

As described above, the structure of the substrate W is not limited to that of FIG. 3, and various structures may be used. For example, as shown in FIG. 9, an SiN film 202 and an $SiO_2$ film 203 may be alternately laminated multiple times on a base 201 such as Si or the like. In the substrate W having such a structure, when the $SiO_2$ film 203 has a small thickness ranging from about 1 nm to 5 nm, it is difficult to sufficiently remove the $SiO_2$ film 203 if the selectivity is low as in the conventional case. However, the $SiO_2$ film 203 can be sufficiently removed by the etching method of the present embodiment.

<Test Example>

Next, a test example will be described.

Here, the etching apparatus of FIG. 1 was used and an $SiO_2$ film of a substrate having the structure of FIG. 9 was etched using the following patterns 1 to 4 while using $NH_3$ gas and HF gas. A thickness of the $SiO_2$ film was set to 3 nm and 5 nm. For the common conditions, a substrate temperature was set to be in a range from 60° C. to 80° C.; a pressure was set to be in a range from 2.67 Pa to 6666 Pa (0.02 Torr to 50 Torr); an $NH_3$ gas flow rate was set to be in a range from 20 sccm to 500 sccm; an HF gas flow rate was set to be in a range from 20 sccm to 500 sccm; an Ar gas flow rate was set to be in a range from 10 sccm to 5000 sccm; and $N_2$ gas flow rate was set to be in a range from 10 sccm to 10000 sccm.

As shown in FIG. 10, the pattern 1 is a sequence (conventional pattern) of (a) initially performing stabilization by supplying Ar gas, $N_2$ gas, and $NH_3$ gas, (b) subsequently supplying HF gas for 3.0 sec in a state where Ar gas, $N_2$ gas, and $NH_3$ gas flow, and (c), thereafter, performing AFS removal for 60 sec. In the pattern 1, the above sequence was repeated 18 times.

As shown in FIG. 11, the pattern 2 is a sequence (HF pulse) of (a) initially performing stabilization by supplying Ar gas, $N_2$ gas, and $NH_3$ gas, (b) subsequently supplying HF gas for 1.5 sec twice in a pulsed manner in a state where Ar gas, $N_2$ gas, and $NH_3$ gas flow, and (c), thereafter, performing AFS removal for 60 sec. In the pattern 2, the above sequence was repeated 22 times.

As shown in FIG. 12, the pattern 3 is a sequence (synchronizing pulse) of (a) initially performing stabilization by supplying Ar gas and $N_2$ gas, (b) subsequently supplying $NH_3$ gas and HF gas simultaneously for 1.5 sec twice in a pulsed manner in a state where Ar gas and $N_2$ gas flow, and (c), thereafter, performing AFS removal for 60 sec. In the pattern 3, the above sequence was repeated 21 times.

As shown in FIG. 13, the pattern 4 is a sequence (present embodiment) of (a) initially performing stabilization by supplying Ar gas and $N_2$ gas, (b) subsequently supplying NH₃ gas and HF gas alternately for 1.5 sec twice in a state where Ar gas and N₂ gas flow, and (c), thereafter, performing AFS removal for 60 sec. In the pattern 4, the above sequence was repeated 61 times.

Figure 14:
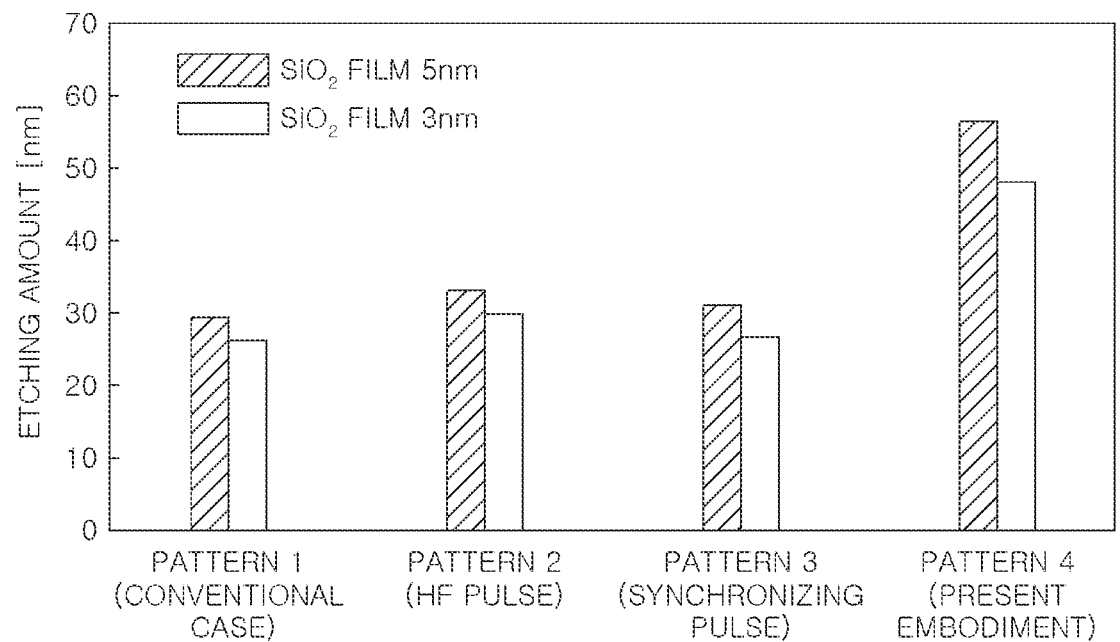
FIG. 14 shows an etching amount of each of the patterns 1 to 4 in the test example.
Figure 15:
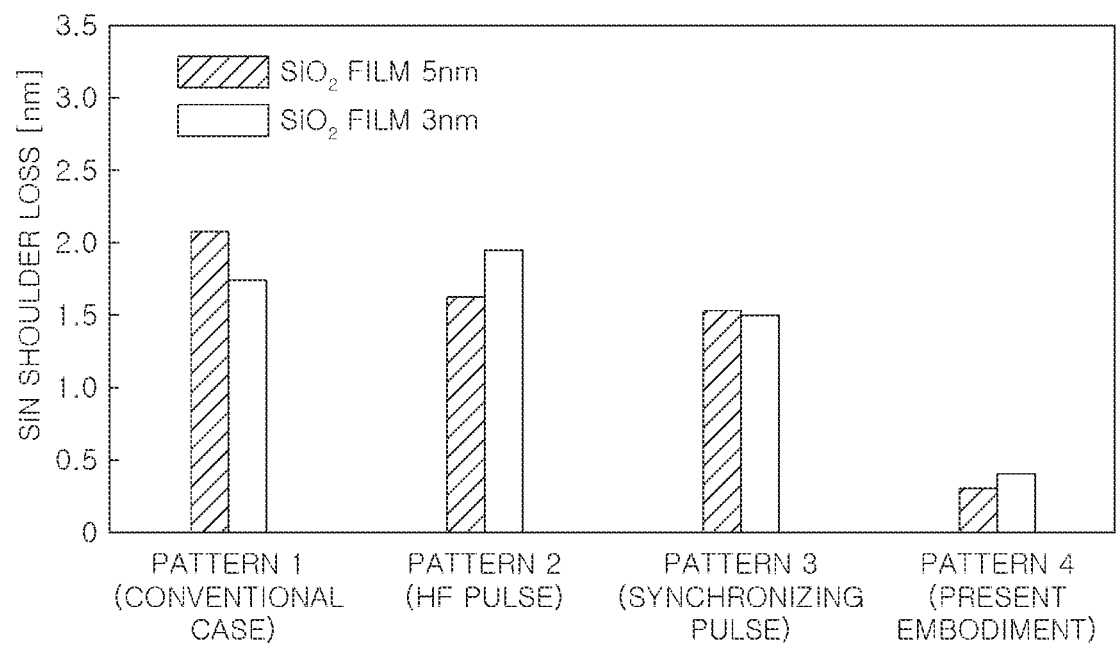
FIG. 15 shows a SiN shoulder loss of each of the patterns 1 to 4 in the test example.
Figure 16:
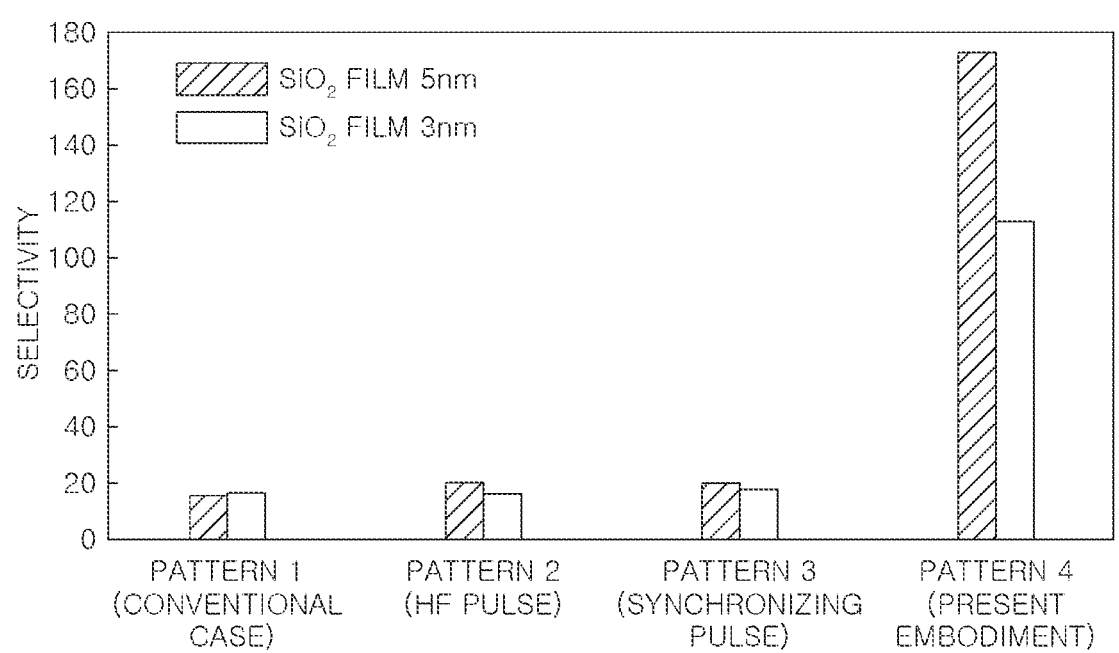
FIG. 16 shows a selectivity of an SiO2 film of each of the patterns 1 to 4 with respect to SiN in the test example.

FIGS. 14 to 16 show an etching amount, a shoulder loss of the SiN film (SiN shoulder loss) calculated from a critical dimension (CD) difference, and a selectivity of the $SiO_2$ film with respect to the SiN film in the case of performing the etching with each of the patterns 1 to 4. As shown in FIG. 14, there was no significant difference in the etching amount among the patterns 1 to 4. On the other hand, as shown in FIG. 15, the SiN shoulder loss calculated from the CD difference was very small in the pattern 4 (present embodiment) compared to the other patterns. Further, as shown in FIG. 16, the selectivity in the pattern 4 (present embodiment) was 100 or higher, which was considerably higher than about 20 in the patterns 1 to 3.

OTHER APPLICATIONS

While various embodiments have been described above, the presently disclosed embodiments are considered in all respects to be illustrative and not restrictive. The above-described embodiments can be embodied in various forms. Further, the above-described embodiments may be omitted, replaced, or changed in various forms without departing from the scope of the appended claims and the gist thereof.

For example, the apparatus of the above-described embodiment is merely an example, and the present disclosure can be applied to apparatuses having various configurations. Further, although the semiconductor wafer is described as an example of the substrate, the substrate is not limited thereto and may be a substrate for flat panel display (FPD) represented by a substrate for liquid crystal display (LCD) or another substrate such as a ceramic substrate or the like.

What is claimed is:

1. An etching apparatus for selectively etching an etching target material of $SiO_2$ with respect to a non-etching material of SiN, comprising:
   a chamber accommodating a substrate containing the etching target material of $SiO_2$ and the non-etching material of SiN;
   a substrate support on which the substrate is placed in the chamber;
   a gas supply mechanism configured to supply a basic gas and a fluorine-containing gas into the chamber;
   an exhaust mechanism configured to exhaust the chamber;
   a temperature controller configured to control a temperature of the substrate on the substrate support; and
   a control unit,
   wherein the control unit controls the gas supply mechanism, the exhaust mechanism, and the temperature controller to repeat a first period for supplying the basic gas, which is started first, and a second period for supplying the fluorine-containing gas, which is started next, with at least a part of the second period not overlapping with the first period, and to heat and remove a reaction product generated by the supply of the basic gas and the supply of the fluorine-containing gas.

2. The etching apparatus of claim 1, wherein the fluorine-containing gas is at least one selected from a group of HF gas, $F_2$ gas, $ClF_3$ gas, and $NF_3$ gas, and the basic gas is at least one selected from a group of $NH_3$ gas and amine gas.

3. The etching apparatus of claim 2, wherein the fluorine-containing gas is the HF gas, the basic gas is the $NH_3$ gas, and the reaction product is $(NH_4)_2SiF_6$.

4. The etching apparatus of claim 3, wherein the control unit controls a temperature of the substrate to 80° C. or lower using the temperature controller.

5. The etching apparatus of claim 4, wherein the control unit controls the temperature of the substrate to be within a range from 60° C. to 80° C. using the temperature controller.

6. An etching apparatus for selectively etching an etching target material of $SiO_2$ with respect to a non-etching material of SiOCN, comprising:
   a chamber accommodating a substrate containing the etching target material of $SiO_2$ and the non-etching material of SiOCN;
   a substrate support on which the substrate is placed in the chamber;
   a gas supply mechanism configured to supply a basic gas and a fluorine-containing gas into the chamber;
   an exhaust mechanism configured to exhaust the chamber;
   a temperature controller configured to control a temperature of the substrate on the substrate support; and
   a control unit,
   wherein the control unit controls the gas supply mechanism, the exhaust mechanism, and the temperature controller to repeat a first period for supplying the basic gas, which is started first, and a second period for supplying the fluorine-containing gas, which is started next, with at least a part of the second period not overlapping with the first period, and to heat and remove a reaction product generated by the supply of the basic gas and the supply of the fluorine-containing gas.

* * * * *